United States Patent [19]

Kadota et al.

[11] Patent Number: 5,432,392
[45] Date of Patent: Jul. 11, 1995

[54] SURFACE WAVE DEVICE

[75] Inventors: Michio Kadota; Naoki Mizoguchi, both of Nagaokakyo, Japan

[73] Assignee: Murata Manufacturing Co., Ltd., Kyoto, Japan

[21] Appl. No.: 180,604

[22] Filed: Jan. 13, 1994

[30] Foreign Application Priority Data

Jan. 14, 1993 [JP] Japan ................... 5-004815
Aug. 31, 1993 [JP] Japan ................... 5-216313
Nov. 29, 1993 [JP] Japan ................... 5-298000

[51] Int. Cl.[6] .............................................. H01L 41/08
[52] U.S. Cl. ............................ 310/313 A; 333/155
[58] Field of Search ........... 310/313 A, 313 R, 313 B; 333/150–155, 193–196

[56] References Cited

U.S. PATENT DOCUMENTS

| | | | |
|---|---|---|---|
| 4,236,095 | 11/1980 | Ono et al. | 310/313 A |
| 4,243,960 | 1/1981 | White et al. | 333/196 |
| 4,342,012 | 7/1982 | Inaba et al. | 333/155 |
| 4,544,857 | 10/1985 | Shimizu et al. | 310/313 B |
| 4,978,879 | 12/1990 | Satoh et al. | 310/313 A |
| 5,160,869 | 11/1992 | Nakahatat et al. | 310/313 A |
| 5,294,858 | 3/1994 | Nakahata et al. | 310/313 A |

Primary Examiner—Mark O. Budd
Attorney, Agent, or Firm—Ostrolenk, Faber, Gerb & Soffen

[57] ABSTRACT

Disclosed herein is a surface wave device utilizing Love waves, which comprises an $LiNbO_3$ single-crystalline substrate (2), at least one interdigital transducer (5) formed thereon and a ZnO thin film (6) formed to cover the interdigital transducer (5). Assuming that H represents the thickness of the ZnO thin film and λ represents the wavelength of the as-excited Love waves, a ratio H/λ is set in a range of 0.01 to 0.2.

13 Claims, 16 Drawing Sheets

ZnO FILM THICKNESS
NORMALIZED BY
WAVELENGTH ( H/λ )

ZnO FILM THICKNESS NORMALIZED BY WAVELENGTH ($H/\lambda$)

SURFACE WAVE DEVICE

BACKGROUND OF THE INVENTION

1. Field of the Invention

The present invention relates to a surface wave device utilizing Love waves, and more particularly, it relates to a surface wave device having a three-layer structure which is formed by a piezoelectric thin film of ZnO, $Ta_2O_5$ or the like, electrodes, and a piezoelectric single-crystalline substrate.

2. Description of the Background Art

For example, a VHF or UHF portable radio communication device must be reduced in size, weight and power consumption. In particular, a local oscillator which is employed for channel selection in such a portable radio communication device must have a wide band, in order to cope with multichannel communication. Thus, a voltage controlled oscillator (VCO), which is an important part of the local oscillator, must also have a wide band, with small size, right weight and low power consumption.

In general, a surface wave resonator utilizing Rayleigh waves is widely employed as that utilizing surface acoustic waves. In such a surface wave resonator utilizing Rayleigh waves, however, it is difficult to attain a wide band due to its small electromechanical coupling factor K. To this end, a surface wave resonator utilizing Love waves is watched with interest as a device having a large electromechanical coupling factor K, which can attain a wide band.

A conventional surface wave resonator utilizing Love waves comprises an Y-cut-X-propagation $LiNbO_3$ substrate and an interdigital transducer (hereinafter referred to as IDT), prepared from a thin film of Au, Ag or Pt, which is formed on the substrate. The IDT is formed by a pair of comb electrodes having plural electrode fingers which interdigitate with each other. According to this structure, the electrodes of a metal which has a slower sound velocity than the $LiNbO_3$ substrate are formed on this substrate, to excite Love waves by such a two-layer structure. The electrodes, which must have a slower sound velocity than the substrate, are made of a material such as Au, Ag or Pt, as hereinabove described.

For example, when such a surface wave resonator is formed by Au electrodes or an Y-cut-X-propagation $LiNbO_3$ substrate, its electromechanical coupling factor K has a large value of about 58% thereby attaining a wide band.

In this case, however, the cost for the surface wave resonator is increased since the metal such as Au, Ag or Pt is high-priced.

In relation to the conventional surface wave resonator utilizing Love waves having a two-layer structure of electrodes and an $LiNbO_3$ substrate, further, it is difficult to form a device having a low frequency as the later mention. When the metal electrodes are prepared from Au and the substrate is formed by an Y-cut-X-propagation $LiNbO_3$ substrate, for example, Love waves are not excited unless a ratio $H(Au)/\lambda$ is at least 0.025 assuming that $H(Au)$ represents the thickness of each electrode and $\lambda$ represents the wavelength of the as-excited Love waves. Therefore, the thickness of electrodes must be increased more than $h/\lambda=0.025$ in a lower frequency. In this case, however, it is impossible to prepare the electrode fingers in desired widths and to obtain a surface wave device having desired characteristics, due to side etching and penetration of an etching solution into clearances between resist layers and the electrodes.

In the conventional Love wave device employing Au electrodes, further, temperature dependence of its resonance frequency is relatively large such that its characteristics are relatively extremely varied with temperature changes.

SUMMARY OF THE INVENTION

An object of the present invention is to provide a surface wave device utilizing Love waves, which can be formed using a low-priced electrode material and employed at a lower frequency with no increase of electrode thicknesses, and which can reduce variation of its resonance frequency with temperatures.

According to a wide aspect of the present invention, a surface wave device utilizing Love waves comprises a piezoelectric substrate, at least one IDT which is formed on the piezoelectric substrate, and a piezoelectric thin film, formed on the piezoelectric substrate to cover the IDT, which is made of a material having a slower surface wave propagation velocity as compared with a material forming the piezoelectric substrate. In this surface wave device, a ratio $H/\lambda$ is set in a range of 0.01 to 0.2, assuming that H represents the thickness of the thin film and $\lambda$ represents the wavelength of the as-excited Love waves.

The aforementioned piezoelectric substrate is prepared from an $LiNbO_3$ substrate, preferably a 0° to 30° rotation Y-cut X-propagation $LiNbO_3$ substrate, or an $LiTaO_3$ substrate, preferably a 36° rotation Y-cut $LiTaO_3$ substrate, for example.

The inventor has found that it is possible to excite Love waves with no strict limitation in relation to the thicknesses of the electrodes and the mass of the electrode material by utilizing a three-layer structure which is obtained by forming electrodes on an $LiNbO_3$ substrate or an $LiTaO_3$ substrate and further forming a piezoelectric thin film having a slower surface wave propagation velocity as compared with the piezoelectric substrate on the electrodes.

According to the present invention, at least one IDT is formed on the aforementioned piezoelectric substrate, and the aforementioned thin film is formed to cover the IDT. Further, a ratio $H/\lambda$ of the thickness H of the thin film to the wavelength $\lambda$ of the as-excited Love waves is set in a range of 0.01 to 0.2, whereby it is possible to excite Love waves so that an electromechanical coupling factor of a sufficient level can be attained even if the thicknesses of the electrodes are varied, as clearly understood from Examples of the present invention as described later.

The aforementioned ratio $H/\lambda$ is set in the range of 0.01 to 0.2, since it is impossible to excite Love waves if the ratio is less than 0.01, while the electromechanical coupling factor is so reduced that it is impossible to attain a wide band if the ratio exceeds 0.02.

The piezoelectric thin film of a material having a slower surface wave propagation velocity than the piezoelectric substrate is prepared from a ZnO thin film, a CdS thin film or a $Ta_2O_5$ thin film, for example.

Preferably, the aforementioned ratio $H/\lambda$ is selected in a range of 0.01 to 0.13, when the piezoelectric substrate is prepared from a 36° rotation Y-cut $LiTaO_3$ substrate. On the other hand, this ratio $H/\lambda$ is preferably set in a range of 0.02 to 0.13 when the thin film is prepared from a ZnO thin film, while the same is preferably set in a range of 0.01 to 0.10 when the thin film is prepared from a CdS thin film.

When the piezoelectric substrate is prepared from a 1° to 30° rotation Y-cut X-propagation LiNbO$_3$ substrate, the ratio H/λ is preferably set in a range of 0.05 to 0.2.

According to the present invention, obtained is a surface wave device which excites Love waves by a three layer structure of a piezoelectric thin film, an IDT and a piezoelectric substrate. According to this structure, further, the ratio H/λ of the thickness H of the thin film to the wavelength λ of the as-excited Love waves is set in the range of 0.01 to 0.2, whereby the electromechanical coupling factor K is increased to be at least 40%, and it is possible to form a surface wave resonator or the like having a wide band. In addition, it is possible to vary the resonance frequency by changing the ratio H/λ while maintaining the electrodes in constant thicknesses. Thus, it is possible to provide a surface wave resonator having a lower resonance frequency, which has been hard to attain in relation to a conventional surface wave resonator utilizing Love waves, having a two-layer structure of Au electrodes and a Y-cut X-propagation LiNbO$_3$ substrate.

In the surface wave device according to the present invention, temperature dependence of its frequency characteristics is reduced as compared with that of a conventional surface wave resonator utilizing Love waves, whereby it is also possible to provide a surface wave device which is stable with respect to temperature changes.

According to the present invention, therefore, it is possible to obtain a surface wave device which is excellent in temperature characteristics as well as electrical characteristics such as resonance.

Preferably, the aforementioned IDT and the thin film are formed on a plus surface of a piezoelectric single-crystalline substrate, so that a larger electromechanical coupling factor K can be thereby obtained. The term "plus surface of the substrate" indicates a major surface which receives plus charges upon application of stress to the substrate. The inventor has examined difference between surface wave propagation characteristics caused by polarity of the substrate in a three-layer structure of an LiNbO$_3$ substrate, an IDT and the aforementioned thin film formed on the substrate. As the result, it has been recognized possible to obtain a higher electromechanical coupling factor K by forming an IDT and a thin film on a plus surface of an LiNbO$_3$ substrate as compared with a case of forming the same on a minus surface, and it has also been found that the degree of allowance of the electromechanical coupling factor K with respect to the thickness H of the thin film is also large in this case. Thus, the IDT and the thin film are preferably formed on a plus surface of a piezoelectric single-crystalline substrate such as an LiNbO$_3$ substrate.

In addition to a surface wave resonator, the present invention is also applicable to another type of surface wave device such as a surface wave filter utilizing Love waves.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Unrestrictive embodiments of the present invention are now described with reference to the accompanying drawings.

First Embodiment

Figure 1A:
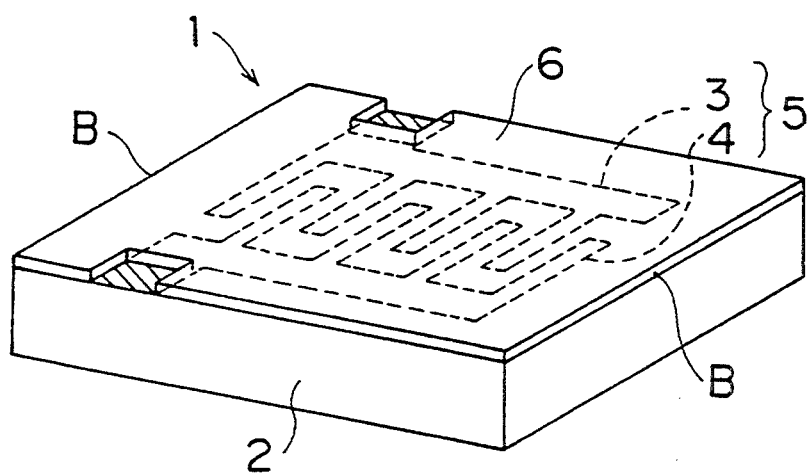
FIG. 1A is a perspective view showing a surface wave device according to an embodiment of the present invention.
Figure 1B:
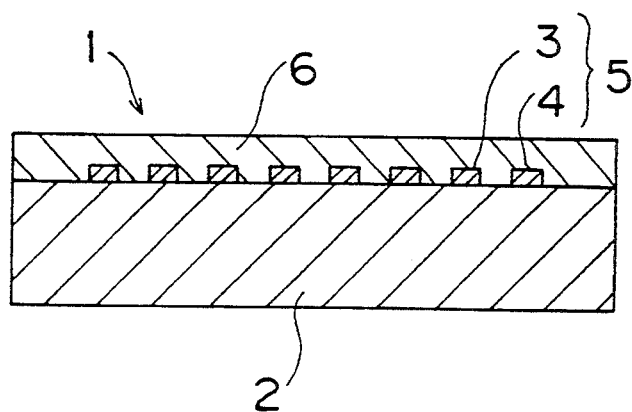
FIG. 1B is a sectional view taken along the line B—B in FIG. 1A.

FIG. 1A is a perspective view showing a surface wave device 1 according to an embodiment of the present invention, and FIG. 1B is a sectional view taken along the line B—B in FIG. 1A.

The surface wave device 1 is implemented as a surface wave resonator utilizing Love waves. This surface wave device 1 comprises a Y-cut X-propagation LiNbO₃ substrate 2 and an IDT 5 which is arranged on an upper surface of the LiNbO₃ substrate 2 so that plural electrode Fingers of comb electrodes 3 and y thereof interdigitate with each other. The IDT 5, which is made of Al in this embodiment, may alternatively be made of another metal material such as Cu or Ni, For example.

A ZnO thin Film 8 is Formed on the LiNbO₃ substrate 2, to cover the IDT 5. According to this embodiment, a patio $H/\lambda$ is set in a range of 0.05 to 0.2 assuming that H represents the thickness of the ZnO thin Film and $\lambda$ represents the wavelength of the as-excited Love waves, as clearly understood From Experimental Example described below.

The reason why the ratio $H/\lambda$ must be set in the range of 0.05 to 0.2 is now described with reference to Experimental Example.

Figure 2:
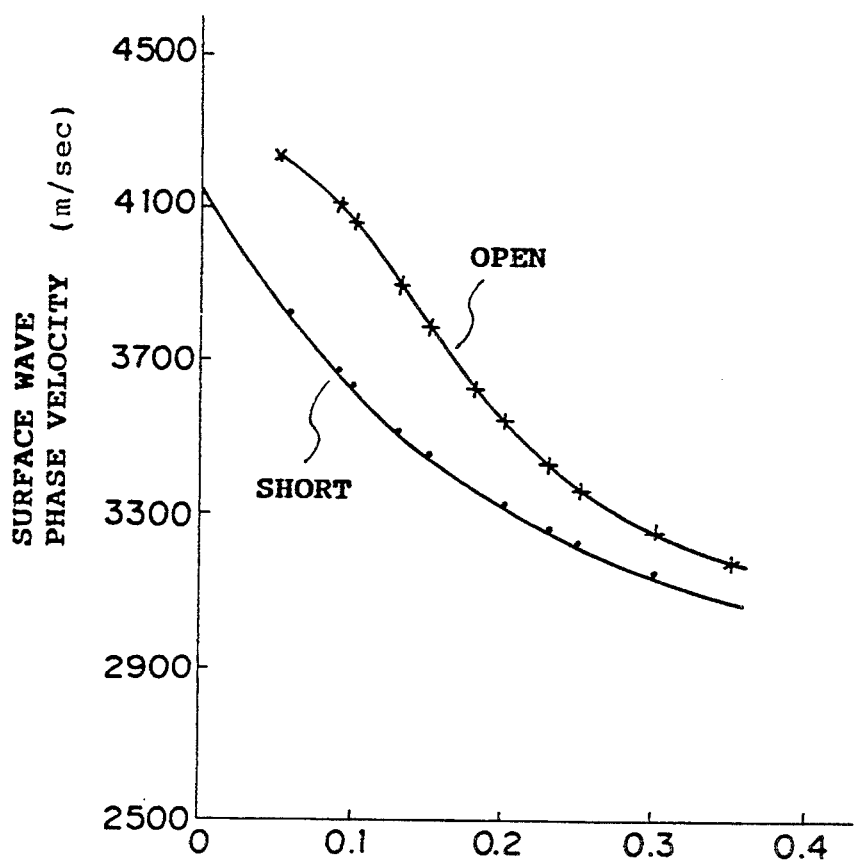
FIG. 2 illustrates dependence of surface wave phase velocities on ratios H/λ in samples of surface wave resonators according to Experimental Example of the present invention.
Figure 3:
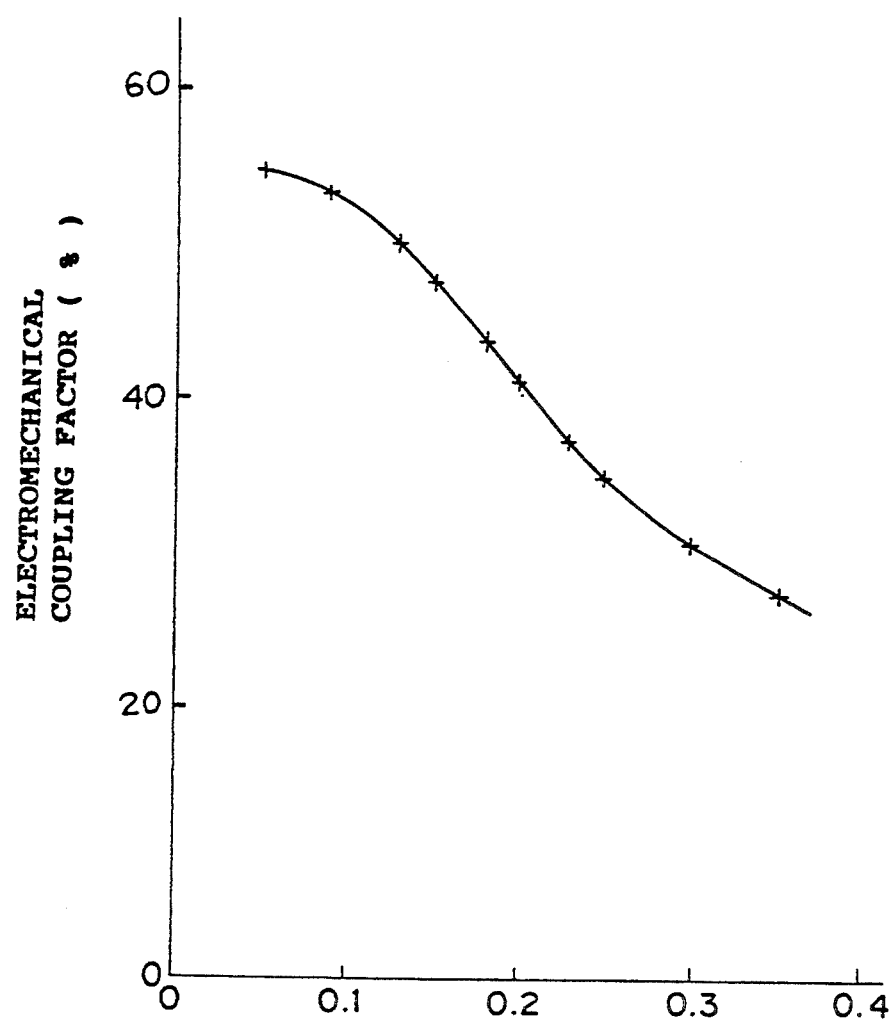
FIG. 3 illustrates dependence of electromechanical coupling factors K on the ratios H/λ in the samples of the surface wave resonators according to Experimental Example of the present invention.

LiNbO₃ substrates 2 of 2.0 mm in width, 1.8 mm in length and 0.5 mm in thickness were prepared and various IDTs 5 and ZnO thin films 6 were formed thereon with various electrode finger pitches and thicknesses, to form a plurality of types of surface wave resonators. The as-obtained surface wave resonators were subjected to measurement of surface wave phase in velocities and electromechanical coupling factors K. The results are shown in FIGS. 2 and 3. Referring to FIG. 2 showing the surface wave phase velocities, the "open" curve shows values in electrical open-circuited states on the plane of IDT and the "short" curve shows those in short-circuited states on the plane of IDT.

It is clearly understood from FIGS. 2 and 3 that Love waves were excited when ratios $H(ZnO)/\lambda$ were in excess of 0.05. It is also understood that the electromechanical coupling factors K, which were at a relatively high level of not less than 50% at a ratio of 0.05, were reduced as the ratios $H(ZnO)/\lambda$ were increased but still in excess of 40% at a ratio of 0.2. Thus, the ratio $H/\lambda$ must be set in a range of 0.05 to 0.2 in the present invention.

Table 1 shows electromechanical coupling factors K and temperature dependence values (change rates (unit: ppm) of ratios $\Delta fr/fr$ per unit temperature, assuming that fr represents resonance frequencies and $\Delta fr$ represents changes of the resonance frequencies) of frequencies in conventional surface wave resonators utilizing Love waves and Rayleigh waves, and samples of the surface wave resonator utilizing Love waves according to this Example. Referring to Table 1, "LN" represents LiNbO₃ substrates, and "Y-X" represents Y-cut X-propagation substrates.

TABLE 1

| Structure | TCF(ppm/°C.) | Wave Type | K (%) |
|---|---|---|---|
| Au/Ln(Y-X) | −112 | Love | at least 55 |
| LN(128° Y-X) | −74 | Rayleigh | 23.5 |
| SiO₂/LN (128° Y-X) | 0 | Rayleigh | 27.6 |
| LN(41° Y-X) | −78−80 | Leaky | 41.5 |
| LN(64° Y-X) | −79−81 | Leaky | 33.6 |
| LN(41° Y-X) | −59 | SSBW | 40.9 |
| LT(36° Y-X) | −45 | SSBW | 21.7 |
| ZnO/Al/LN(Y-X) (H/λ = 0.09) | −76 | Love | 50.0 |
| ZnO/Al/Ln(Y-X) (H/λ = 0.16) | −66 | Love | 42.4 |

Figure 9:
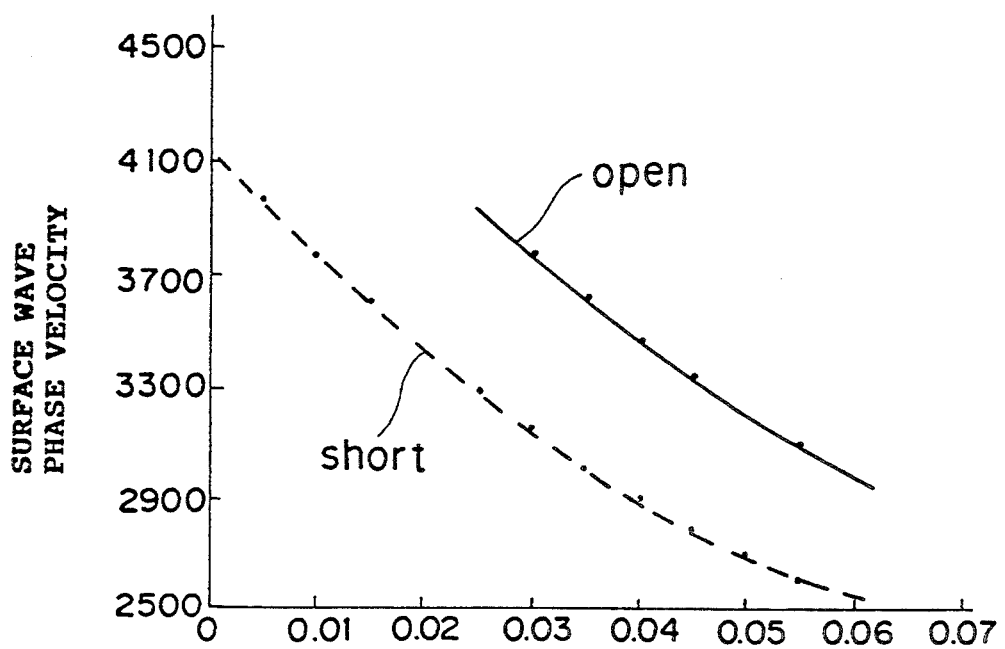
FIG. 9 illustrates dependence of surface wave phase velocities on ratios H(Au)/λ in samples of conventional surface wave resonators utilizing Love waves.
Figure 10:
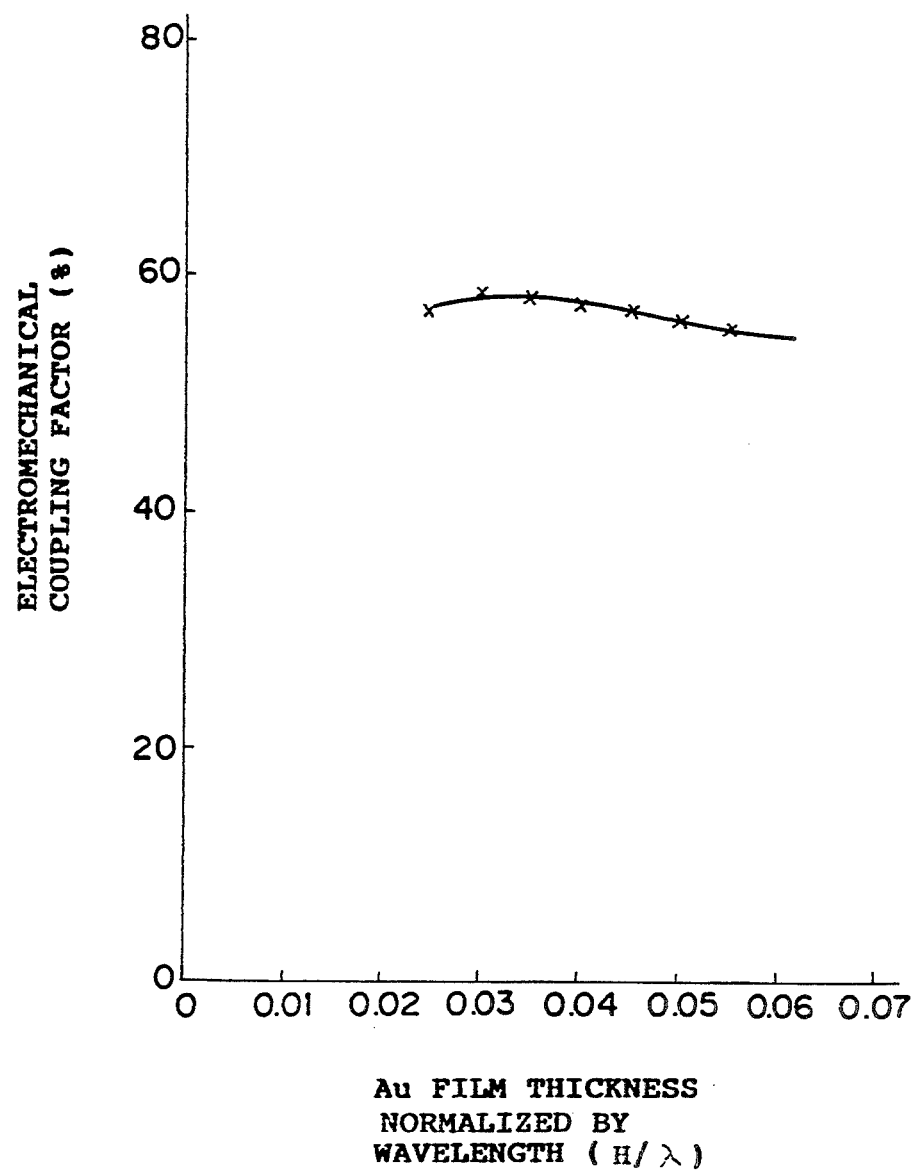
FIG. 10 illustrates dependence of electromechanical coupling factors K on the Patios H(Au)/λ in the samples of the conventional surface wave resonators utilizing Love waves.

For the purpose of comparison, FIGS. 9 and 10 show relations between surface wave phase velocities, electromechanical coupling factors K and electrode thicknesses $H(Au)/\lambda$ in conventional surface wave devices utilizing Love waves, which were formed by Au electrodes and Y-cut X-propagation LiNbO₃ substrates. Referring to FIG. 9, the "open" curve shows values in electrical open-circuited states on the plane of IDT and the "short" curve shows values in short-circuited states on the plane of IDT.

It is clearly understood from Table 1 and FIGS. 9 and 10 that Love waves were not excited in the conventional surface wave resonators comprising the LiNbO₃ substrates and the Au electrodes provided thereon, unless the ratios $H(Au)/\lambda$ were at least 0.025. Thus, it was impossible to obtain a low-frequency surface wave resonator unless the thickness of electrodes were increased (: $\lambda$ was increased.).

It is also understood from Table 1 that the conventional surface wave resonators utilizing Rayleigh waves exhibited small electromechanical coupling factors K of not more than 30% regardless of the types of the substrates and hence it was impossible to attain wide bands.

In the surface wave resonators according to this Example, on the other hand, it was possible to attain wide bands with high electromechanical coupling factors K of at least 40% at both ratios of $H/\lambda$ of 0.09 and 0.16.

In addition, it is also understood from FIG. 3 that a device having a low frequency can be manufactured without increasing electrodes in thickness since the electromechanical coupling factor is varied with the thickness of the ZnO thin film even if the thicknesses of the electrodes are maintained constant.

Figure 4:
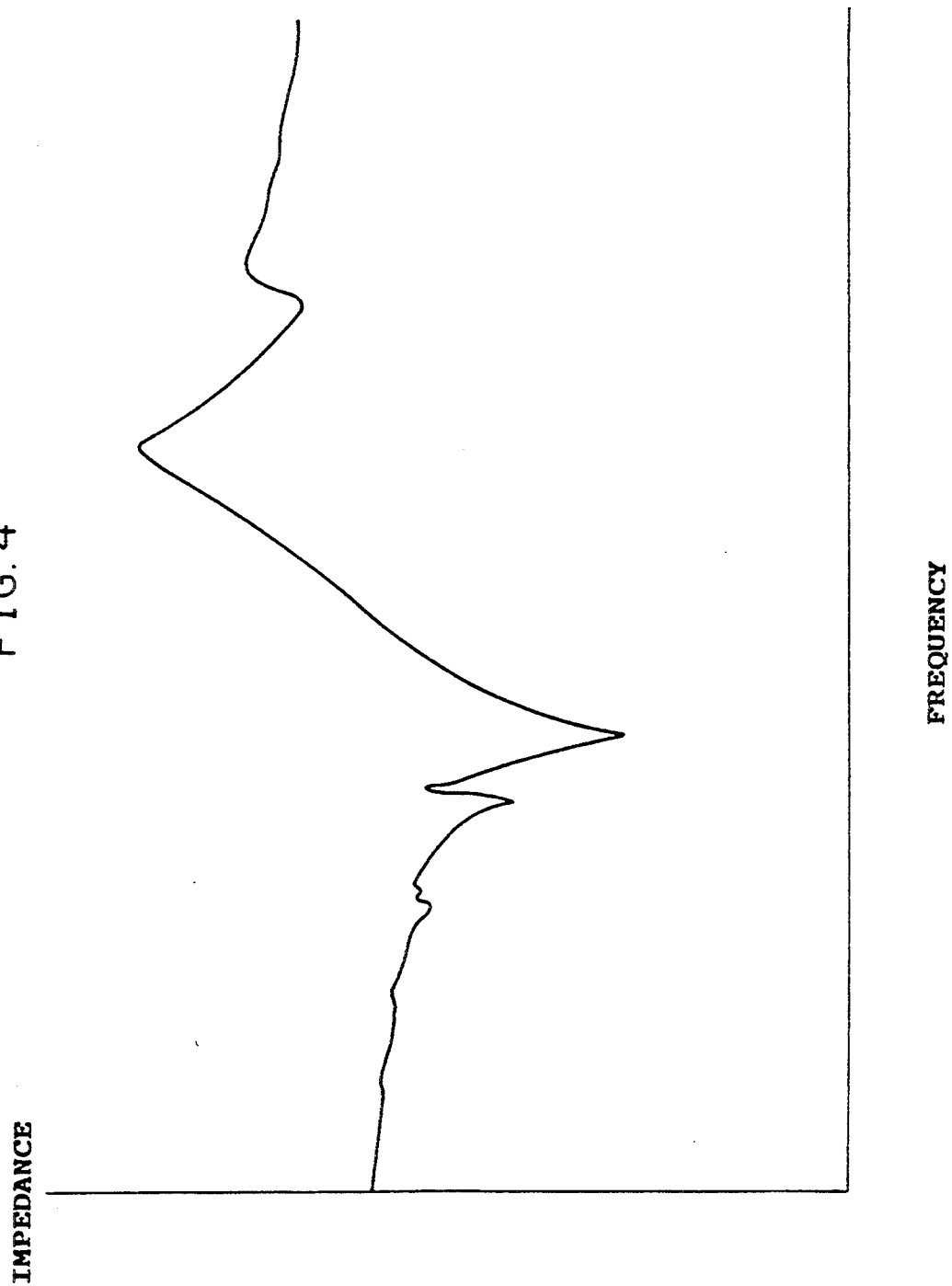
FIG. 4 illustrates exemplary frequency characteristics of impedance of a sample of a surface wave resonator according to Experimental Example of the present invention.
Figure 5:
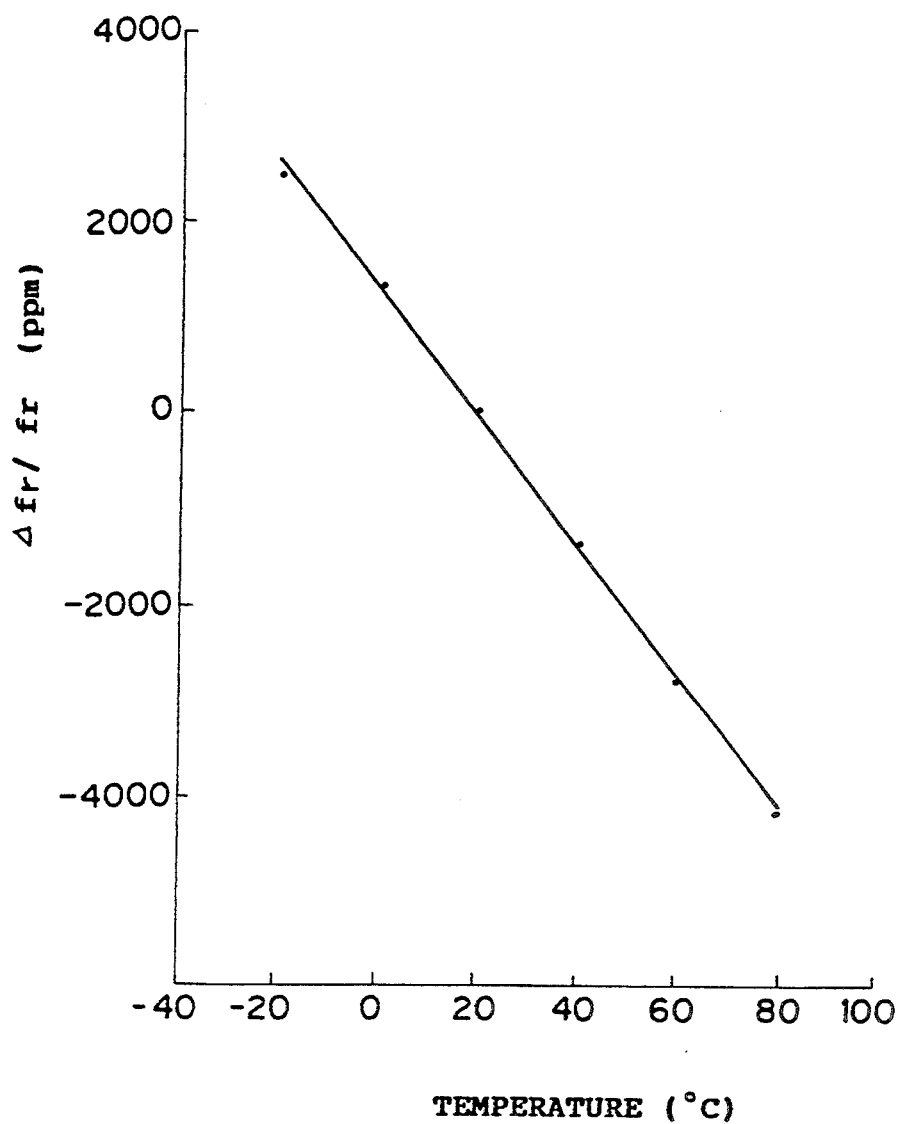
FIG. 5 illustrates changes of a resonance frequency with respect to the temperature in the sample of the surface wave resonator according to Experimental Example of the present invention.

In relation to the surface wave resonator of this Example obtained in the aforementioned manner, a sample was prepared with an IDT of Al having 25 pairs of electrode fingers with a finger-to-finger pitch of 4.5 μm, a finger cross width of 526 μm and a metallization ratio of 0.51 as described below, and a ZnO thin film of 2.0 μm in thickness, and subjected to measurement of impedance frequency characteristics and a temperature change rate $\Delta fr/fr$ of its resonance frequency. FIGS. 4 and 5 show the results.

It is clearly understood from FIG. 5 that the surface wave resonator according to this Example exhibited a frequency change rate TCF of −66 ppm/°C. in relation to the temperature, which was better than a TCF value of −112 ppm/°C. in the conventional surface wave resonator utilizing Love waves (see Table 1). Thus, it is possible to reduce temperature dependence of the resonance frequency according to the present invention.

Figure 6:
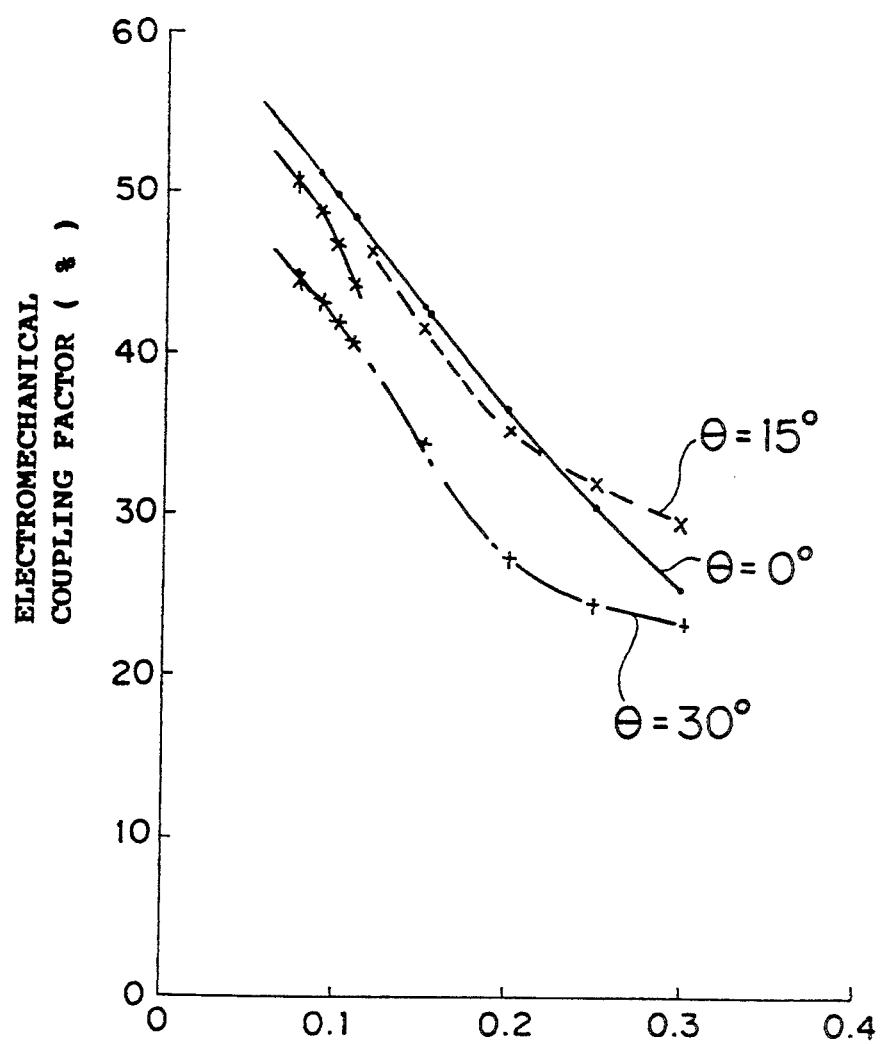
FIG. 6 illustrates dependence of electromechanical coupling factors K on ratios H(ZnO)/λ in a case of changing angles of rotation of Y-cut X-propagation LiNbO$_3$ substrates.

On the other hand, IDTs similar to the above were formed on three types of LiNbO₃ substrates having different cut angles, and subjected to investigation of relations between electromechanical coupling factors K and the ratios $H/\lambda$. Table 6 shows the results. Referring to FIG. 6, curves of $\theta=0°$, $\theta=15°$ and $\theta=30°$ show the results of a Y-cut X-propagation LiNbO₃ substrate, a 15° rotation Y-cut X-propagation LiNbO₃ substrate and a 30° rotation Y-cut X-propagation LiNbO₃ substrate as employed. It is clearly understood from FIG. 6 that all samples employing the Y-cut X-propagation LiNbO₃ substrates exhibited sufficient electromechanical coupling factors K at ratios H(ZnO)/λ in a range of 0.05 to 0.25, at angles of rotation of up to 30°.

Figure 7:
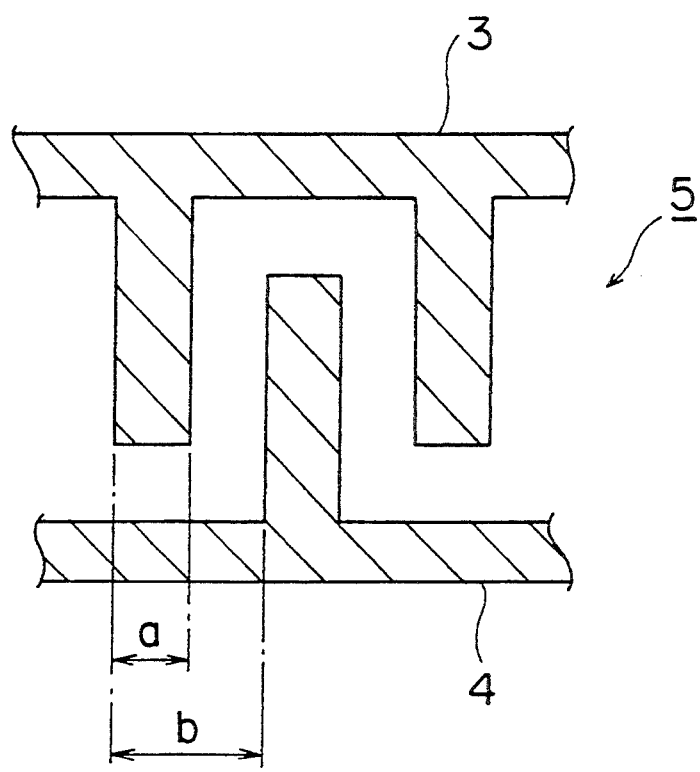
FIG. 7 is a partially enlarged plan view showing an electrode part, for illustrating a metallization ratio.

Then, changes of electromechanical coupling factors depending on metallization ratios in IDTs were confirmed by an experiment. Samples of surface wave resonators were formed by ZnO thin films, IDTs of Al and Y-cut X-propagation LiNbO$_3$ substrates with various ratios of electrode finger widths a to finger-to-finger pitches b, i.e., metallization ratios a/b, as shown in FIG. 7 in an enlarged manner, and subjected to measurement of electromechanical coupling factors K. The ZnO thin films were 3 μm in thickness, and the IDTs of Al were 3000 Å in thickness.

Figure 8:
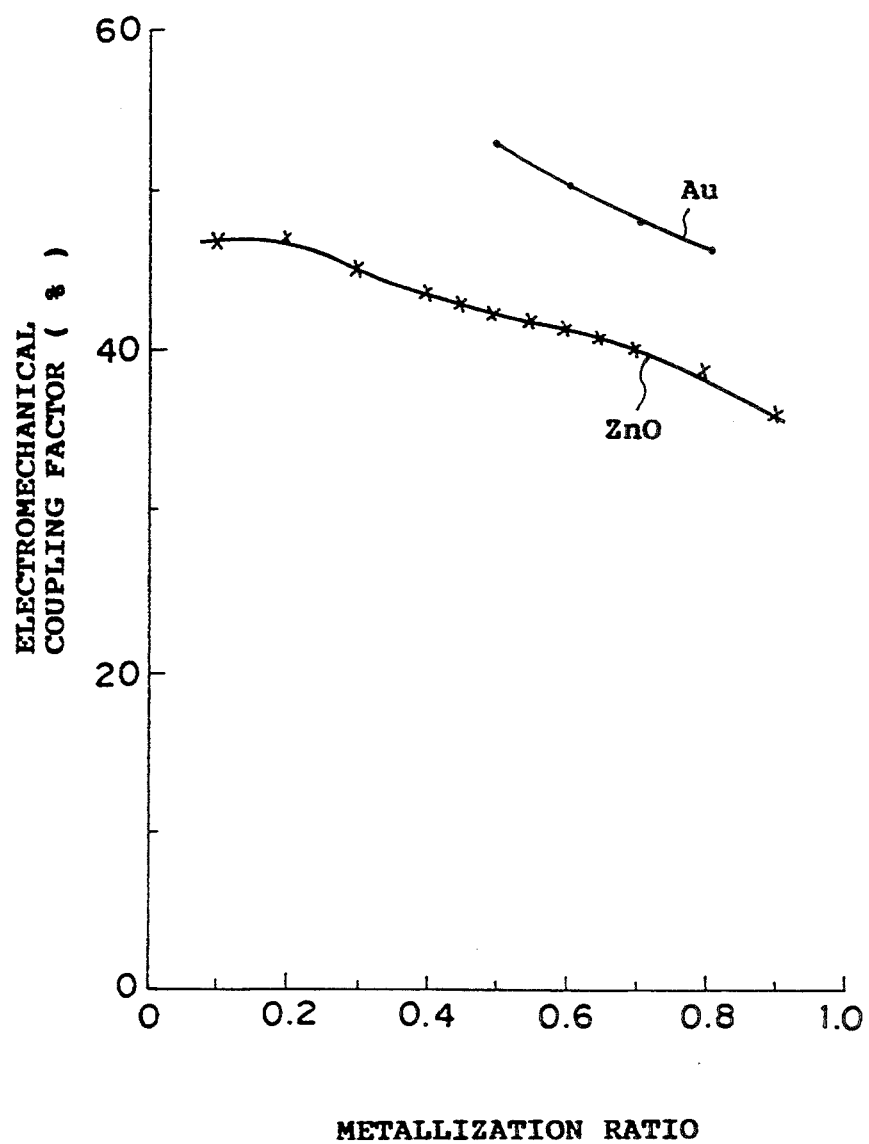
FIG. 8 illustrates dependence of electromechanical coupling factors K on metallization ratios in a sample of a surface wave resonator according to Example of the present invention and a sample of a conventional surface wave resonator.

Table 2 and FIG. 8 show the results. For the purpose of comparison, FIG. 8 also shows a relation between an electromechanical coupling factor K and a metallization ratio in a conventional surface wave resonator which was formed by an IDT of an Au thin film having a thickness of 1.0 μm formed on a Y-cut X-propagation LiNbO$_3$ substrate (metallization ratio=0.5).

TABLE 2

| Metallization Ratio | Resonance Frequency | Impedance Raio(dB) | Δf/fr (%) |
|---|---|---|---|
| 0.43 | 174.5 | 51.3 | 12.1 |
| 0.51 | 175.4 | 51.6 | 11.8 |
| 0.63 | 173.6 | 50.2 | 11.5 |
| 0.74 | 173.3 | 41.8 | 10.3 |

(ZnO: 2 μm Al: 3000Å)

Δf= |Antiresonance Frequency—Resonance Frequency|
fr: Resonance Frequency

It is clearly understood from Table 2 and FIG. 8 that the electromechanical coupling factors K of not less than 40% can be obtained in case of the metallization ratio being in the range of 0.1 to 0.7, particularly, the electromechanical coupling factors K were increased as the metallization ratios were reduced in case of the metallization ratio being in the range of 0.2 to 0.7 in the samples of the surface wave resonator according to this Example.

Love wave resonator employing Au electrodes cannot be excited unless its metallization ratio is at least 0.5. By contrast, it is possible to increase further the electromechanical coupling factor K to not less than 40% in the inventive surface wave resonator utilizing Love waves, even if the metallization ratio is not more 0.5 as described above. Thus, it is possible to obtain a surface wave resonator of a wide band in case of setting the metallization ratio even at a level of not more than 0.5. However, the manufacturing the resonator becomes to be difficult if the metallization ratio is less than 0.1. On the other hand, the electromechanical coupling factor K is extremely reduced or rippling is easily caused if the metallization ratio exceeds 0.7. Therefore, the metallization ratio is preferably set in a range of 0.1 to 0.7.

Referring again to FIG. 6, the characteristic curve of θ=15° is parted in the vicinity of the ratio H(ZnO)/λ of 0.11, conceivably because mode conversion was caused around this ratio H(ZnO)/λ.

Second Embodiment

The inventor has found that it is possible to increase the electromechanical coupling factor K in the surface wave resonator utilizing Love waves shown in FIGS. 1A and 1B when the IDT and the ZnO thin Film are Formed on a plus surface of a Y-cut X-propagation LiNbO$_3$ substrate, as compared with a case of forming these elements on a minus surface.

Description is now made on difference in Love wave propagation properties in a case of forming an IDT and a ZnO thin Film on a plus surface of an LiNbO$_3$ substrate and a case of Forming the same on a minus surface, on the basis of Experimental Example.

Figure 11:
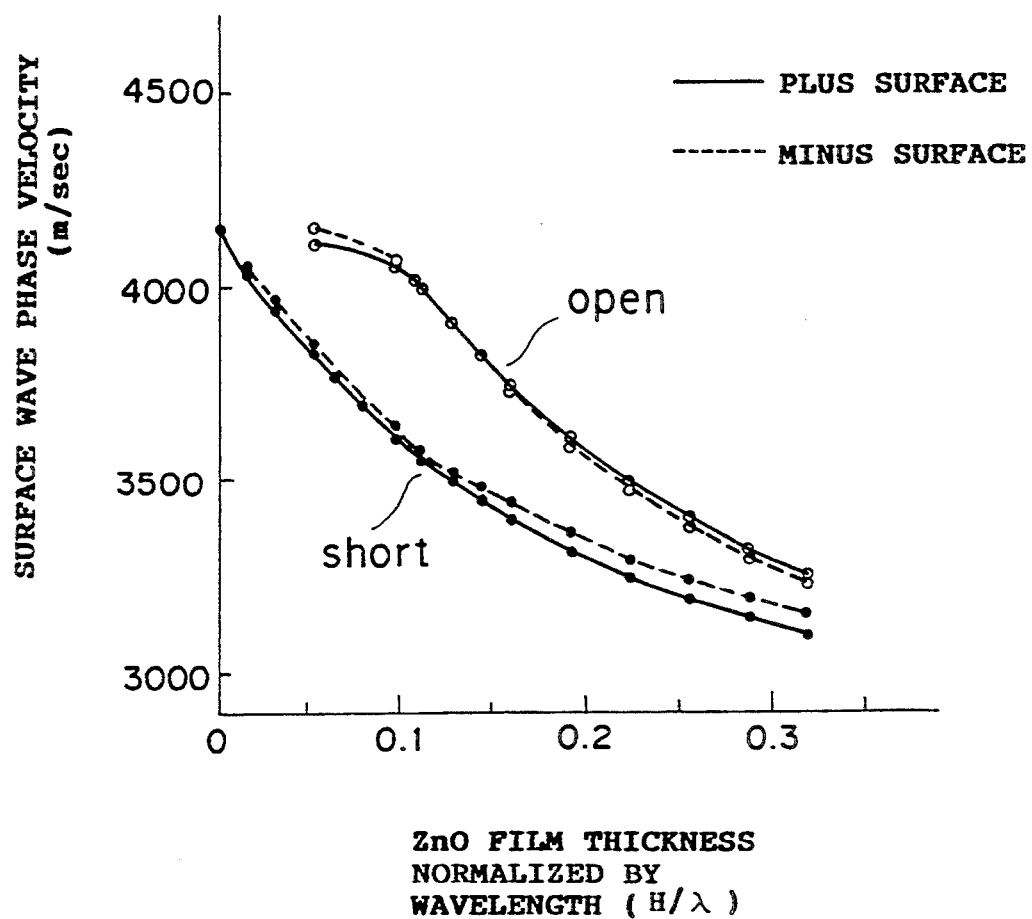
FIG. 11 illustrates dependence of surface wave phase velocities on ratios H/λ in samples of surface wave resonators according to another Example of the present invention.
Figure 12:
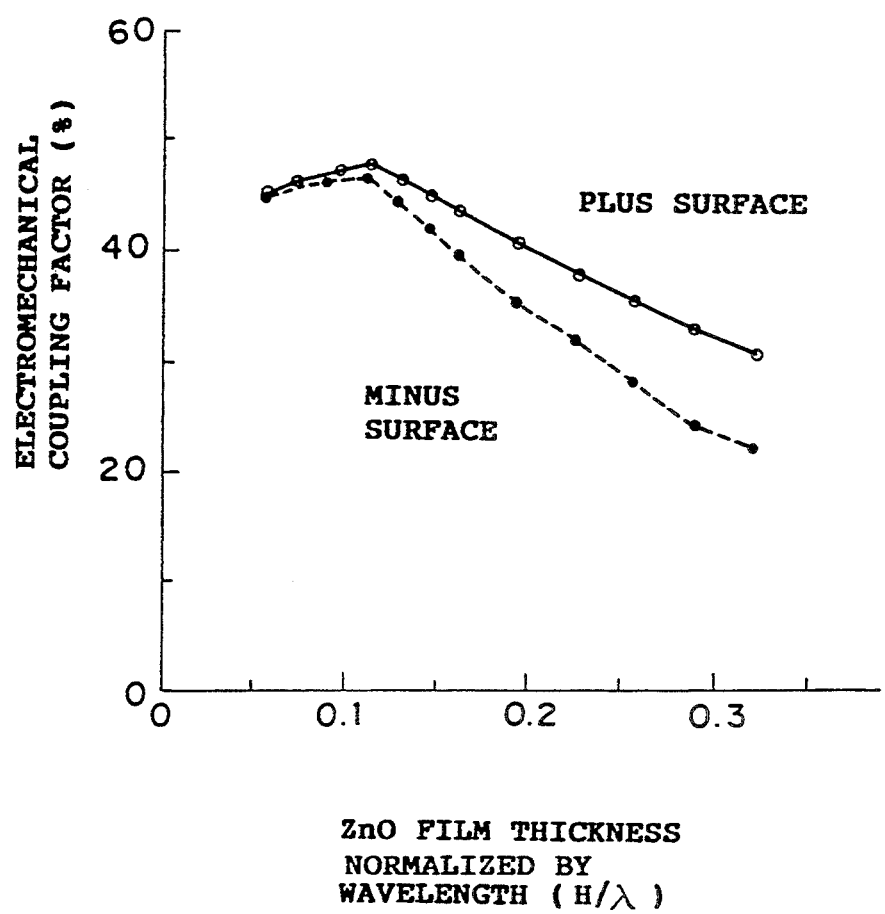
FIG. 12 illustrates dependence of electromechanical coupling factors K on the Patios H/λ in this Example of the present invention.

A plurality of types of surface wave resonators were prepared by employing LiNbO$_3$ substrates of 2.0 mm in width, 1.8 mm in length and 0.5 mm in thickness, and forming various IDTs having different finger-to-finger pitches and various ZnO thin films having different thicknesses on plus or minus surfaces of the substrates. The as-obtained surface wave resonators were subjected to measurement of surface wave phase velocities and electromechanical coupling factors K. FIGS. 11 and 12 show the results of measurement. Referring to these figures, solid lines show the results of the samples having the IDTs and the ZnO thin films formed on the plus surfaces of the LiNbO$_3$ substrates (hereinafter referred to as plus surfaces), and dotted lines show the results of those having the IDTs and the ZnO thin films formed on the minus surfaces of the LiNbO$_3$ substrates (hereinafter referred to as minus surfaces). Referring to FIG. 11, the "open" curves show the results in electrical open-circuited states on the plane of IDT, and the "short" curves show the results in short-circuited states on the plane of IDT.

Where the values in FIGS. 2, 3, 6, 8, 9 and 10 are caluculated by Finite Element Method (FEM) taking acount of the presence of IDT. On the other hand, the values in FIGS. 11 and 12 are caluculated by a method of J. J. Campbell et al. (J. J. Campbell and W. R. Jone: "A method for estimating optimal crystal cuts and propagating directions for excitation of piezoelectric surface waves", IEEE trans., su-15,4, P209 (October 1968)). The later values show slightly lower those by FEM.

It is clearly understood from FIGS. 11 and 12 that Love waves were excited when H/λ were at least 0.05 in both of the plus and minus surfaces, assuming that H represents the thicknesses of the ZnO thin films and λ represents the wavelengths of the Love waves. The electromechanical coupling factors K were about 48% on the plus surface and about 46% on the minus surface when the ratios H/λ were 0.11, for example, and reduced as the ratios H/λ were increased. In other words, it is understood that higher electromechanical coupling factors K were obtained on the plus surfaces. Further, electromechanical coupling factors K exceeding the target value of 40% were obtained on the plus surfaces when the ratios H/λ were not more than 0.2.

It is also understood that inclination of the electromechanical coupling factors K with respect to ratios H(ZnO)/λ was also looser on the plus surfaces, with higher degrees of allowance of the electromechanical coupling factors K with respect to the thicknesses of the ZnO films.

It is further clearly understood from FIG. 12 that a low frequency surface wave resonator can be manufactured without increasing the thicknesses of electrodes since the electromechanical coupling factor K is varied with the thickness of a ZnO thin film even if the electrodes are maintained constant in thickness.

It has been also confirmed that temperature dependence of frequency characteristics in the inventive surface resonator was smaller than that of the conventional surface wave resonator utilizing Love waves.

Third Embodiment

A third embodiment of the present invention is prepared by employing a 36° rotation Y-cut LiTaO$_3$ substrate (hereinafter simply referred to as an LiTaO$_3$ substrate) as a piezoelectric substrate and forming a ZnO thin film, a CdS thin film or a Ta$_2$O$_5$ thin film on the LiTaO$_3$ substrate.

The 36° rotation Y-cut LiTaO$_3$ substrate was found as a substrate provided with a cut angle having no damping in a process of calculating rotation Y-cut leaky surface waves, and reported as a surface wave substrate For SH waves ("SH-Type and Rayleigh Type Surface Acoustic Waves in LiTaO$_3$" by Nakamura, Inmi and Shimizu, JEICE Tech. Report (Japan), US77-42 (1977)). It is known that this LiTaO$_3$ substrate has a temperature characteristic TCF of about $-25°$ to $-32$ ppm/°C.

Samples of piezoelectric substrates were prepared by forming ZnO thin films of various thicknesses on the aforementioned LiTaO$_3$ substrates having excellent temperature characteristics, to try excitation of Love waves. Excitation of Love waves was analyzed as to both of cases of forming ZnO thin Films on plus surfaces and minus surfaces of the LiTaO$_3$ substrates respectively.

The Following piezoelectric basic equation, equation of motion and Maxwell's equation hold in both of the LiTaO$_3$ substrates and the ZnO thin films:
Piezoelectric Basic Equation $$T_1 = C_{ij}S_j - e_{mi}E_m$$

$$D_n = e_{nh}S_h + \epsilon_{nm}E_m$$

Equation of Motion
Maxwell's Equation
In order to excite Love waves, a sound velocity may be so $$\rho \frac{\partial^2 u_i}{\partial t^2} = \frac{\partial T_{ji}}{\partial x_j}$$

$$\text{div} = 0$$

obtained that these equations satisfy respective boundary conditions on the surface of the ZnO thin film and in the boundary between the ZnO thin film and the LiTaO$_3$ substrate. When IDT is formed on the piezoelectric substrate, the electromechanical coupling factor K is obtained from a surface wave velocity $V_m$ in a case of electrical short-circuited on the plane of IDT and a surface wave velocity VF in case of open-circuit on the plane of IDT.

Figure 13:
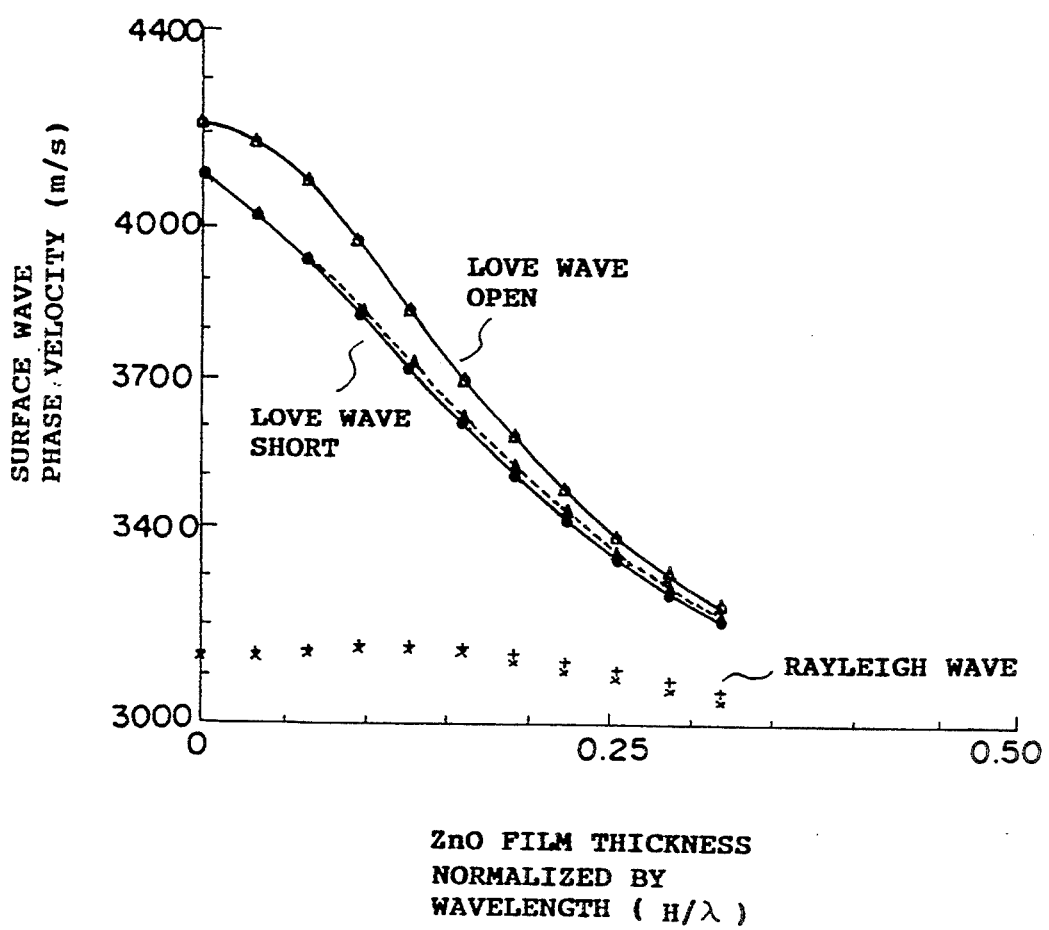
FIG. 13 illustrates relations between relative thicknesses H/λ of ZnO thin films formed on 36° Y-cut LiTaO$_3$ substrates and sound velocities of surface waves.

FIG. 13 shows the results of measurement of the aforementioned surface wave velocities $V_F$ and $V_m$ on piezoelectric substrates obtained by depositing ZnO thin films of various thicknesses on the aforementioned LiTaO$_3$ substrates. Referring to FIG. 13, marks ○ and indicate sound velocities $V_f$ of Love waves on free boundaries and sound velocities $V_m$ of Love waves on metallized boundaries of ZnO thin films formed on plus surfaces of the LiTaO$_3$ substrates respectively. On the other hand, marks and Δ indicate sound velocities $V_f$ of Love waves on free boundaries and sound velocities $V_m$ of Love waves on metallized boundaries of ZnO thin films formed on minus surfaces of the LiTaO$_3$ substrates respectively.

It is clearly understood from FIG. 13 that the sound velocities remained unchanged on both of the ZnO thin films which were formed on the plus and minus surfaces.

Referring to FIG. 13, further, marks X and + indicate sound velocities of Rayleigh waves on the ZnO thin films which were formed on the plus and minus surfaces of the LiTaO$_3$ substrates respectively. It is understood that the sound velocities $V_f$ and $V_m$ on the free and metallized boundaries were substantially identical to each other with electromechanical coupling factors of zero, and the Rayleigh waves were not excited. It is also understood that the inventive piezoelectric substrates were hardly influenced by Rayleigh wave components since no Rayleigh wave components existed between the sound velocities $V_f$ and $V_m$ of the Love waves.

Figure 14:
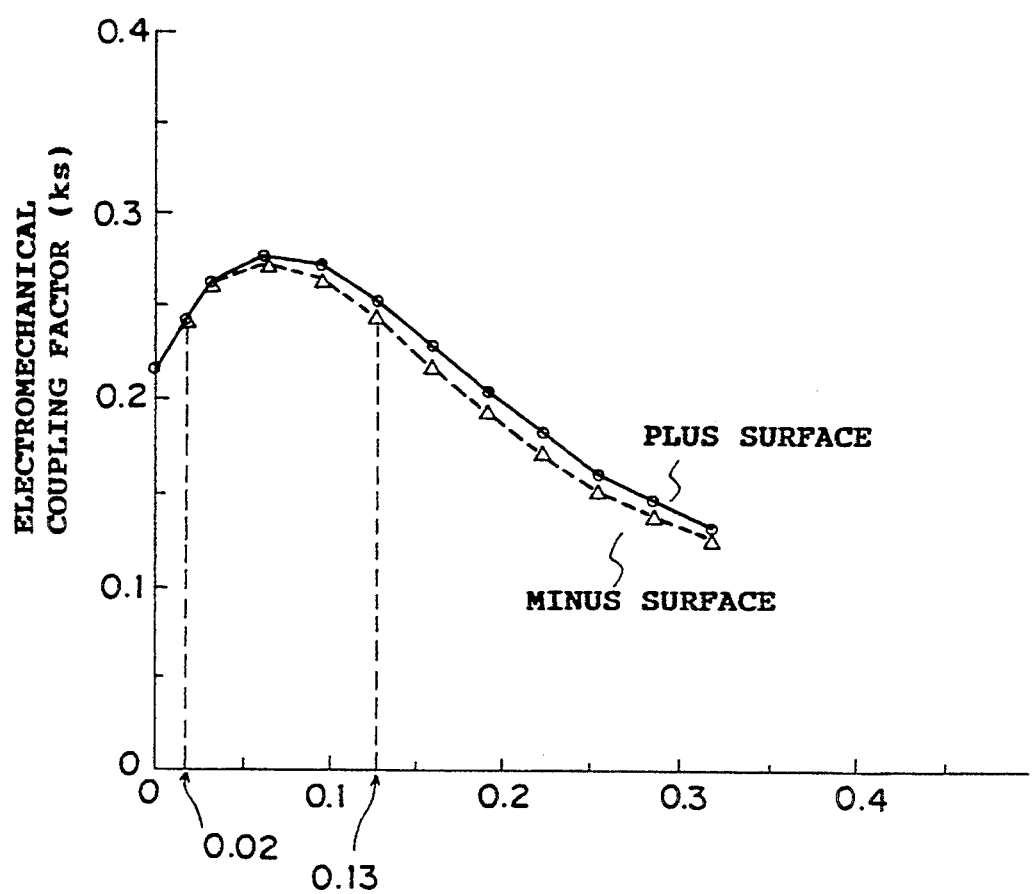
FIG. 14 illustrates relations between electromechanical coupling factors K and the thicknesses H/λ of the ZnO thin films formed on the 36° Y-cut LiTaO$_3$ substrates.

FIG. 14 shows electromechanical coupling factors Ks of samples prepared by forming ZnO thin films of various thicknesses on the aforementioned LiTaO$_3$ substrates. Referring to FIG. 14, marks ○ indicate results of the samples prepared by forming the ZnO thin films on plus surfaces of the LiTaO$_3$ substrates, and marks Δ indicate the results of those prepared by forming the ZnO thin filmson minus surfaces. It is clearly understood from FIG. 14 that the electromechanical coupling factors Ks were slightly larger in the samples provided with the ZnO thin films which were formed on the plus surfaces of the LiTaO$_3$ substrates than those in the samples provided with the ZnO thin films which were formed on the minus surfaces.

It is also understood possible to increase the electromechanical coupling factor in excess of 22% by setting a relative thickness H/λ of a ZnO thin film in a range of 0.02 to 0.13 as compared with a case provided with no such ZnO thin film, on whichever surface the ZnO thin film is formed. Thus, it is understood that the inventive piezoelectric substrate has an excellent temperature characteristic TCF of about $-25°$ to $-32$ ppm/°C. since both of the ZnO thin film and the LiTaO$_3$ substrate exhibit relatively excellent temperature characteristics TCF (TCF$=-30$ ppm/°C. in the ZnO thin film, and TCF$=-25°$ to $-32$ ppm/°C. in the LiTaO$_3$ substrate), and the electromechanical coupling factor can be relatively increased by selecting the thickness of the ZnO thin film in the aforementioned specific range.

Figure 15:
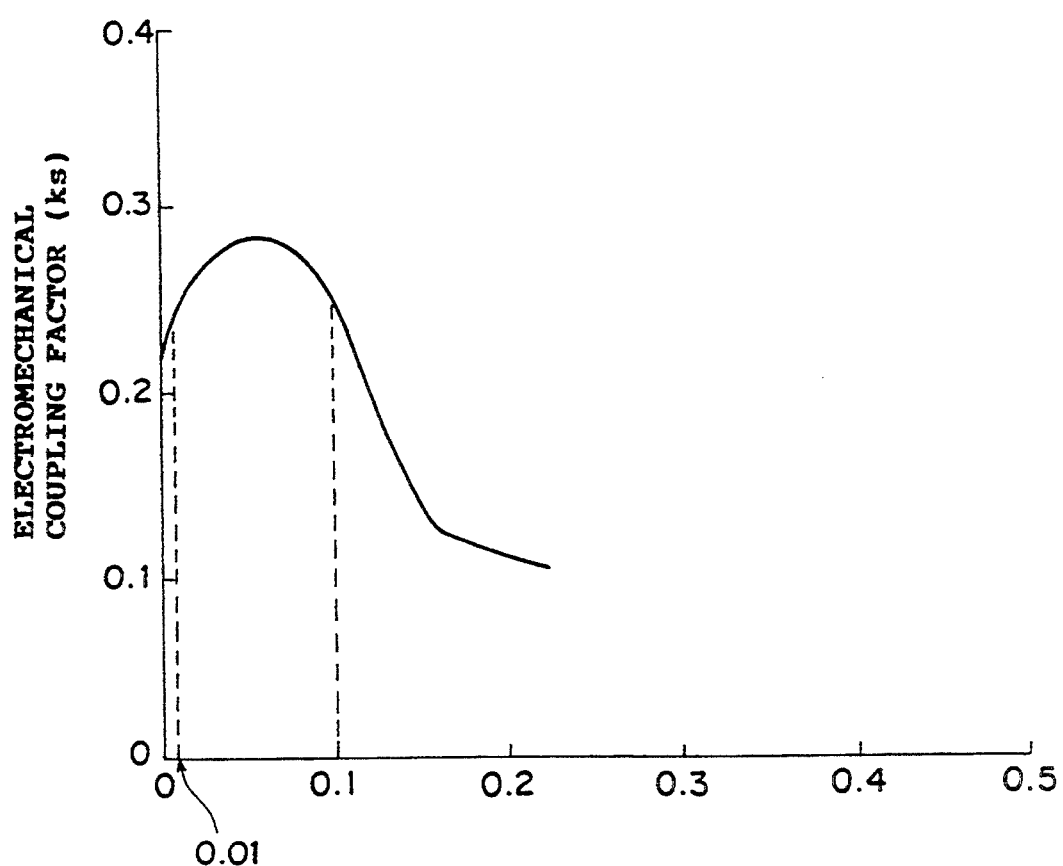
FIG. 15 illustrates relations between thicknesses H/λ of CdS thin films formed on 36° rotation Y-cut LiTaO$_3$ substrates and electromechanical coupling factors K.

FIG. 15 shows electromechanical coupling factors Ks of Love waves in samples prepared by forming CdS thin films of various thicknesses on the plus surfaces of the aforementioned LiTaO$_3$ substrates, in place of the ZnO thin films. As clearly understood from FIG. 15, it was possible to increase the electromechanical coupling factors Ks to at least 24% as compared with substrates provided with no CdS thin films when the thicknesses (H/λ) of the CdS thin films were set in a range of 0.01 to 0.10, thereby obtaining piezoelectric substrates having high electromechanical coupling factors Ks of Love waves. Also the piezoelectric substrates according to this embodiment exhibited excellent temperature characteristics TCF of about$-25°$ to $-32$ ppm/°C., since the CdS thin films and the LiTaO$_3$ substrates had excellent temperature characteristics (TCF$\dot{=}-41$ ppm/°C. in the CdS thin films).

The aforementioned LiTaO$_3$ substrates were provided thereon with thin films having slower sound velocities of Love waves as compared with the LiTaO$_3$ substrates. Such a thin film can be prepared from a material such as Ta$_2$O$_5$, in place of ZnO or CdS.

Figure 16:
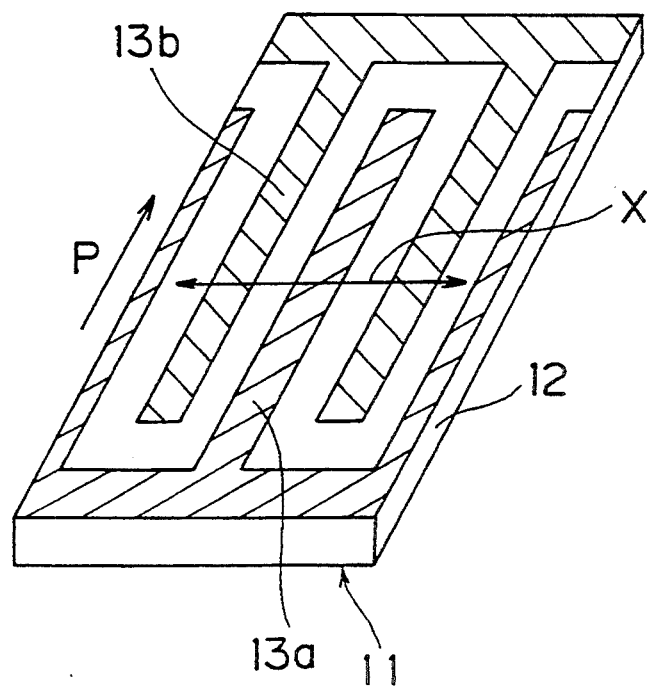
FIG. 16 is a perspective view showing an exemplary surface wave device to which the present invention is applied.

The third embodiment of the present invention can be implemented along a generally known method in relation to a surface wave device employing the aforementioned piezoelectric substrate as to a concrete structure of the surface wave device such as formation of interdigital electrodes. For example, it is possible to provide a resonator having excellent temperature and resonance characteristics by employing the piezoelectric substrate of the aforementioned embodiment in an end reflection type surface wave resonator 1 shown in FIG. 16. Referring to FIG. 16, the surface wave resonator 1 comprises a piezoelectric substrate 2 to which the present invention is applied, and a pair of comb electrodes 3a and 3b having plural electrode fingers interdigitating with each other.

It should be noted that the values in FIGS. 11 and 12 are caluculated by a method of J. J. Campbell et al.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface wave device utilizing Love waves, comprising:
   a substrate of a piezoelectric single crystal;
   at least one interdigital transducer formed on said substrate of a piezoelectic single crystal; and
   a piezoelectric thin film of a material that is slower in surface wave propagation velocity than said piezoelectric single-crystalline substrate,
   a ratio H/λ being set in a range of 0.01 to 0.2, wherein H is the thickness of said thin film and λ is the wavelength of Love waves that are excited in said device.

2. A surface wave device in accordance with claim 1, wherein said thin film being slower in Love wave sound velocity than said piezoelectric single-crystalline substrate is made of one material being selected from a group of ZnO, CdS and $Ta_2O_5$.

3. A surface wave device utilizing Love waves, comprising:
   a substrate of a piezoelectric single crystal prepared from a 0° to 30° rotation Y-cut X-propagation $LiNbO_3$ substrate;
   at least one interdigital transducer formed on said substrate of a piezoelectric single crystal; and
   a piezoelectric thin film of a material that is slower in surface wave propagation velocity than said piezoelectric single-crystalline substrate,
   a ratio H/λ being set in a range of 0.05 to 0.2, wherein H represents the thickness of said thin film and λ represents the wavelength of the as-excited Love waves.

4. A surface wave device in accordance with claim 3, wherein said thin film is a ZnO thin film.

5. A surface wave device in accordance with claim 3, wherein said interdigital transducer and said thin film are formed on a plus surface of said $LiNbO_3$ substrate.

6. A surface wave device in accordance with claim 5, wherein said thin film is a ZnO thin film.

7. A surface wave device in accordance with claim 3, wherein said interdigital transducer is provided with a pair of comb electrodes having plural electrode fingers interdigitating with each other, a ratio of the width of each said electrode finger to a finger-to-finger pitch being in a range of 0.1 to 0.7.

8. A surface wave device in accordance with claim 7, wherein said thin film is a ZnO thin film.

9. A surface wave device utilizing Love waves, comprising:
   a substrate of a piezoelectric single crystal;
   at least one interdigital transducer formed on said substrate of a piezoelectric single crystal; and
   a piezoelectric thin film of a material that is slower in surface wave propagation velocity than said piezoelectric single-crystalline substrate,
   wherein said piezoelectric single-crystalline substrate is a 36° rotation Y-cut $LiTaO_3$ substrate, and a ratio H/λ is set in a range of 0.01 to 0.13, wherein H represents the thickness of said thin film and λ represents the wavelength of the as-excited Love waves.

10. A surface wave device in accordance with claim 9, wherein said thin film is a ZnO thin film, and said ratio H/λ is in a range of 0.02 to 0.13.

11. A surface wave device in accordance with claim 9, wherein said thin film is made of CdS, and said ratio H/λ is in a range of 0.01 to 0.10.

12. A surface wave device in accordance with claim 9, wherein said interdigital transducer and said thin film are formed on a plus surface of said $LiTaO_3$ substrate.

13. A surface wave device in accordance with claim 9, wherein said thin film being slower in Love wave sound velocity than said piezoelectric single-crystalline substrate is made of one material being selected from a group of ZnO, CdS and $Ta_2O_5$.

* * * * *